(12) United States Patent
Zhang et al.

(10) Patent No.: US 11,508,919 B2
(45) Date of Patent: Nov. 22, 2022

(54) STRETCHABLE ELECTRONIC MATERIAL AND DEVICES

(71) Applicant: Georgia Tech Research Corporation, Atlanta, GA (US)

(72) Inventors: Guoyan Zhang, Atlanta, GA (US); Michael McBride, Atlanta, GA (US); Ping-Hsun Chu, Atlanta, GA (US); Elsa Reichmanis, Atlanta, GA (US); Nils Erland Persson, Atlanta, GA (US)

(73) Assignee: Georgia Tech Research Corporation, Atlanta, GA (US)

(*) Notice: Subject to any disclaimer, the term of this patent is extended or adjusted under 35 U.S.C. 154(b) by 433 days.

(21) Appl. No.: 16/642,506

(22) PCT Filed: Aug. 28, 2018

(86) PCT No.: PCT/US2018/048399
§ 371 (c)(1),
(2) Date: Feb. 27, 2020

(87) PCT Pub. No.: WO2019/046335
PCT Pub. Date: Mar. 7, 2019

(65) Prior Publication Data
US 2020/0381637 A1    Dec. 3, 2020

Related U.S. Application Data

(60) Provisional application No. 62/550,758, filed on Aug. 28, 2017.

(51) Int. Cl.
*H01L 51/00*    (2006.01)

(52) U.S. Cl.
CPC ...... *H01L 51/0097* (2013.01); *H01L 51/0034* (2013.01); *H01L 51/0094* (2013.01)

(58) Field of Classification Search
CPC .................................................. H01L 51/0097
See application file for complete search history.

(56) References Cited

U.S. PATENT DOCUMENTS

| | | | |
|---|---|---|---|
| 11,349,088 B2* | 5/2022 | Dong | H01L 51/56 |
| 2003/0211649 A1 | 11/2003 | Hirai et al. | |
| 2005/0241409 A1* | 11/2005 | Taylor | G01L 1/205 |
| | | | 73/841 |
| 2009/0278116 A1 | 11/2009 | Yamate | |
| 2014/0039290 A1 | 2/2014 | De Graff et al. | |
| 2014/0131685 A1 | 5/2014 | Im et al. | |
| 2016/0104850 A1* | 4/2016 | Joo | B32B 27/283 |
| | | | 428/116 |

(Continued)

OTHER PUBLICATIONS

International Search Report and Written Opinion from application No. PCT/US2018/048399 dated Nov. 14, 2018 (12 pages).

*Primary Examiner* — Douglas M Menz
(74) *Attorney, Agent, or Firm* — Troutman Pepper Hamilton Sanders LLP; Ryan A. Schneider

(57) ABSTRACT

Devices and methods relating stretchable electronics are disclosed. Some disclosed embodiments relate to a stretchable electronic film comprising an insulating polymer and less than 1 wt % of a semiconducting polymer. Other disclosed embodiments relate to manufacturing a multi-layered, stretchable electronic device characterized by a single peel-off step for integrating all components of the device rather than a multi-peel synthesis of the device.

20 Claims, 4 Drawing Sheets

(56) References Cited

U.S. PATENT DOCUMENTS

2016/0136877 A1* 5/2016 Rogers ................. B32B 27/283
    156/163
2017/0331057 A1   11/2017 Chung et al.
2020/0207952 A1* 7/2020 Hatakeyama ............ H01B 1/22

* cited by examiner

STRETCHABLE ELECTRONIC MATERIAL AND DEVICES

CROSS-REFERENCE TO RELATED APPLICATION

This Application is a national stage application under 35 USC § 371 of International Application No. PCT/US18/048399 filed 28 Aug. 2018, which International Application claims priority under 35 USC § 119(e) to U.S. Provisional Patent Application No. 62/550,758 filed 28 Aug. 2017, the contents of each is hereby incorporated in its entirety as if fully set forth herein.

FIELD OF INVENTION

The present disclosure relates to stretchable electronic materials and devices and methods of making the same. In some aspects, the disclosure relates to industry-scale production of stretchable displays and wearable electronic devices.

BACKGROUND

Stretchable electronics fabrication has garnered significant attention from research and industry due to its essential role in the realization of large-area, wearable, epidermal and biomedical electronics. Polymer transistors, as the fundamental building blocks for state-of-the-art stretchable electronics, are necessary for economically viable wearable optoelectronic devices. Approaches for fabricating stretchable transistors have been investigated. One approach includes leveraging geometric structure design to impart stretchability to brittle materials. Another approach entails utilizing intrinsically elastic electrode or semiconductor materials directly as device components.

Generally, the manufacturing processes used to fabricate such devices include vacuum evaporation, photolithographic patterning, or multi-step peel-off-transfer-printing. However, because of the elaborate synthesis process of intrinsically elastic semiconducting polymers and the multi-step transfer manufacturing process for device fabrication, such stretchable transistors have been mostly achieved in small-area devices and few studies have focused on the fabrication of large area highly stretchable transistors. Moreover, to date, none of the above-mentioned approaches allow for scalable fabrication of large area, highly stretchable polymer transistors with stable carrier mobility. Thus, the practical implementation of stretchable devices has not been realized, and alternative approaches should be explored.

SUMMARY

Embodiments of the presently disclosed technology can comprise a stretchable film, comprising an insulating polymer, and a semiconducting polymer, wherein the semiconducting polymer is present in an amount of 0.1 wt % to 3 wt %. In some embodiments, the semiconducting polymer is present in an amount of 0.5 wt % to 1 wt %.

Embodiments of the presently disclosed technology can comprise a stretchable electronic device, comprising, a semiconducting film, comprising, an insulating polymer and a semiconducting polymer, wherein the semiconducting polymer is present in an amount of 0.1 wt % to 3 wt %, a first electrode composition disposed above the film, a second electrode composition disposed below the film, and a passivation layer disposed below the second electrode composition. In some embodiments, the semiconducting polymer is present in an amount of 0.5 wt % to 1 wt %.

Embodiments of the presently disclosed technology can comprise a method for manufacturing a stretchable electronic device, the method comprising depositing an insulating polymer onto at least a portion of an inorganic substrate, depositing a first electrode composition onto at least a portion of the inorganic substrate, depositing a film, comprising an insulating polymer and a semiconducting polymer, wherein the semiconducting polymer is present in an amount of 0.1 wt % to 3 wt %, onto at least a portion of the inorganic substrate, depositing a second electrode composition onto at least a portion of the film, depositing a passivation layer onto at least a portion of the second electrode composition, wherein at least the first electrode composition adheres to the film, and the second electrode composition adheres to the film and the passivation layer to form the stretchable electronic device, and separating the stretchable electronic device from the inorganic substrate. In some embodiments, the semiconducting polymer is present in an amount of 0.5 wt % to 1 wt %.

Further features of the disclosed technology, and the advantages offered thereby, are explained in greater detail hereinafter with reference to specific embodiments illustrated in the accompanying drawings, wherein like elements are indicated be like reference designators.

BRIEF DESCRIPTION OF THE FIGURES

Reference will now be made to the accompanying figures, which are not necessarily drawn to scale, and wherein.

DETAILED DESCRIPTION

Figure 1:
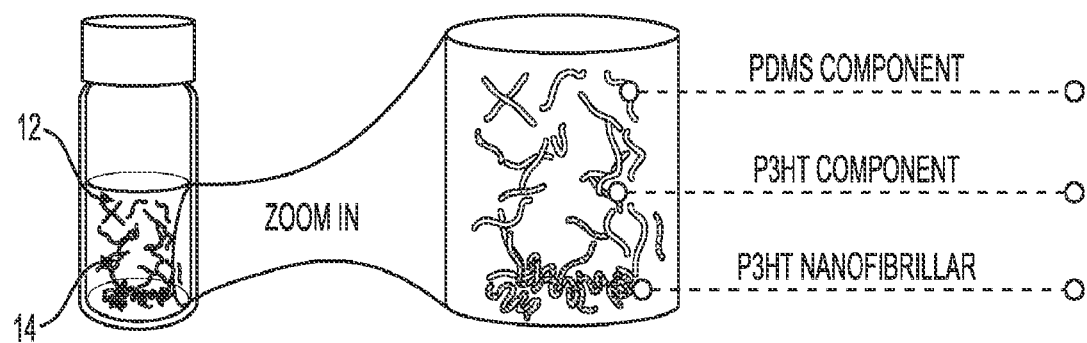
FIG. 1 depicts an exemplary embodiment of fabrication of a stretchable film.

Although preferred embodiments of the disclosure are explained in detail, it is to be understood that other embodiments are contemplated. Accordingly, it is not intended that the disclosure is limited in its scope to the details of construction and arrangement of components set forth in the following description or illustrated in the drawings. The disclosure is capable of other embodiments and of being practiced or carried out in various ways. Also, in describing the preferred embodiments, specific terminology will be resorted to for the sake of clarity.

It must also be noted that, as used in the specification and the appended claims, the singular forms "a," "an" and "the" include plural referents unless the context clearly dictates otherwise.

Also, in describing the preferred embodiments, terminology will be resorted to for the sake of clarity. It is intended that each term contemplates its broadest meaning as understood by those skilled in the art and includes all technical equivalents which operate in a similar manner to accomplish a similar purpose.

Ranges can be expressed herein as from "about" or "approximately" one particular value and/or to "about" or "approximately" another particular value. When such a range is expressed, another embodiment includes from the one particular value and/or to the other particular value.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

It is also to be understood that the mention of one or more method steps does not preclude the presence of additional method steps or intervening method steps between those steps expressly identified. Similarly, it is also to be understood that the mention of one or more components in a device or system does not preclude the presence of additional components or intervening components between those components expressly identified.

Disclosed herein are systems and methods for developing versatile stretchable polymer films and leveraging those films to produce stretchable optoelectronic devices. For example, some embodiments are drawn to a stretchable electronic device, comprising a semiconducting film, comprising an insulating polymer and a semiconducting polymer, a first electrode composition disposed above the film a second electrode composition disposed below the film and a passivation layer disposed below the second electrode composition. There are many distinct advantages of this device, including observed enhancement of elasticity, optical transparency and charge-carrier mobility.

Figure 2:
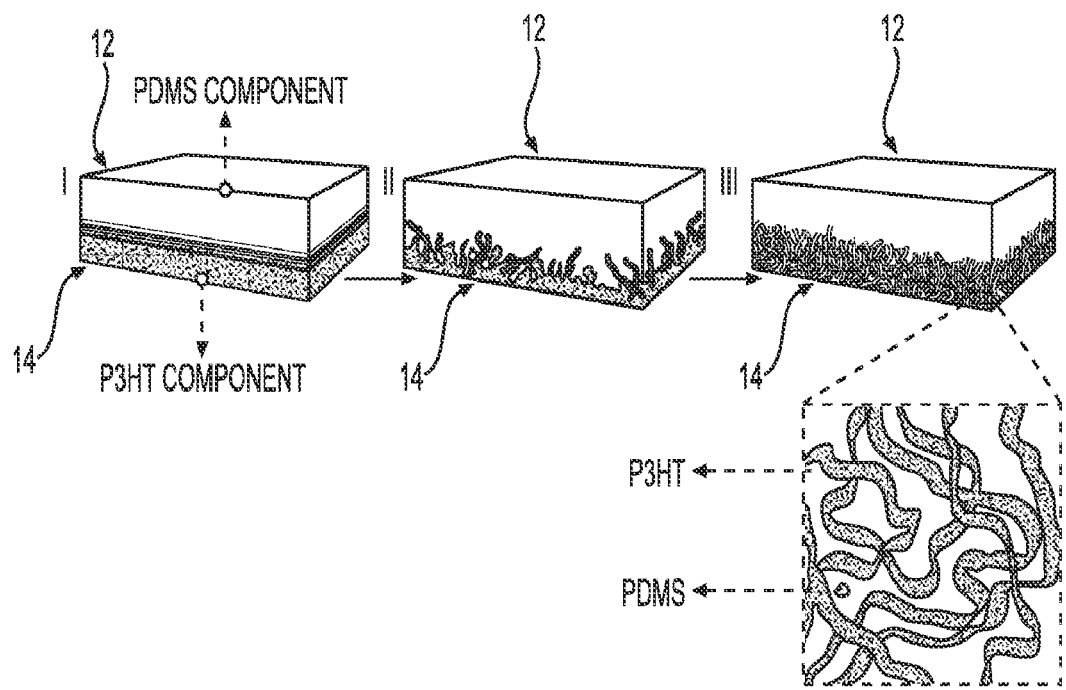
FIG. 2 depicts an exemplary embodiment of a stretchable film.

In some embodiments, as shown in FIG. 1, an insulating polymer 12 can be mixed with a semiconducting polymer 14 in solution to form a stretchable film. In some embodiments, the solvent of the solutions can comprise chloroform ($CHCl_3$) or the like. In some embodiments, large repulsive interactions between the two immiscible polymers can accelerate aggregation of the semiconducting polymer 14 in solution. As shown in FIG. 2, in some embodiments, a film 16 is formed and separates into two metastable layers, the top layer primarily comprising the insulating polymer 12, and the bottom layer primarily comprising the semiconducting polymer 14. In some embodiments, an interpenetrating network structure can be formed. In some embodiments, the chloroform fully evaporates, leaving only the phase separated, interpenetrating film.

In some embodiments, the insulating polymer can be selected from a group consisting of silicone-based polymers (e.g. EcoFlex), polyurethane (PU), butadiene-styrene copolymers, Poly(vinylidene fluoride-co-hexafluoropropylene) (PVDF-HFP) copolymers, styrene ethylene butylene styrene block copolymer (SEBS), combinations thereof, and the like. In some embodiments, the insulating polymer can comprise polydimethylsiloxane (PDMS).

In some embodiments, the semiconducting polymer can be selected from a group consisting of poly(3-hexylthiophene-2,5-diyl) (P3HT), poly[2,5-(2-octyldodecyl)-3,6-diketopyrrolopyrrole-alt-5,5-(2,5-di(thien-2-yl)thieno [3,2-b]thiophene)] (DPP-DTT) and poly(2,5-bis(2-octyldodecyl)-3,6-di(pyridin-2-yl)-pyrrolo[3,4-c]pyrrole-1,4(2H,5H)-dione-alt-2,2'-bithiophene) (DPPDPyBT).

The weight fraction of the semiconducting polymer useful to form the films described herein can be from 0.1 to 3 wt % (e.g. 0.2 wt %, 0.3 wt %, 0.5 wt % 0.7 wt %, 0.9 wt %, 1.1 wt %, 1.3 wt %, 1.6 wt %, 1.9 wt %, 2.1 wt %, 2.5 wt %, 2.7 wt %, 2.9 wt %). In some embodiments, the semiconducting polymer has a weight fraction of 0.4 to 1 wt % (e.g. 0.49 wt %, 0.67 wt %, 0.83 wt %).

In some embodiments, to exhibit stretchability, the film can have a Young's Modulus of at least 0.5 MPa, a tensile strength of at least 1.5 MPa, and/or a break strain of at least 50%. For example, an insulating PDMS polymer can exhibit stretchability at a Young's Modulus from 0.8 to 3.0 MPa, a tensile strength from 2.1 to 8.2 MPa, and/or a break strain from 85% to 100%. In some embodiments, the semiconducting polymer can exhibit stretchability at a Young's Modulus from 0.6 to 2.8 MPa, a tensile strength from 1.7 to 7.6 MPa, and/or a break strain from 125% to 200%. In an embodiment where PDMS is blended with P3HT, the PDMS-P3HT semiconducting film can exhibit stretchability at a Young's Modulus from 1.3 to 1.8 MPa, a tensile strength from 2.5 to 3.6 MPa, and/or a break strain from 180% to 200%.

Figure 3:
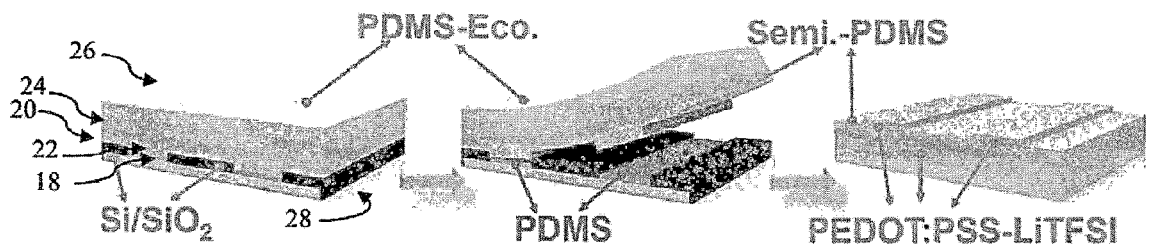
FIG. 3 depicts an exemplary embodiment of a stretchable electronic device.

In some embodiments, as shown in FIG. 3, a stretchable electronic device can include the stretchable film 20 (as shown in FIG. 2). In some embodiments, a first electrode composition 22 can be disposed above the film. In some embodiments, a second electrode composition 24 can be disposed below the film. In some embodiments, a passivation layer 26 can be disposed below the second electrode composition 24.

In some embodiments, the first electrode composition can be selected from a group consisting of metal nanoparticles, nanowire, nanosheet-based electrodes (e.g. gold, silver, copper, nickel), CNT-based electrode, graphene-based electrode, carbon-based electrode, poly(3,4-ethylenedioxythiophene):poly(styrenesulfonate)-bis(trifluoromethane) sulfonimide lithium salt (PEDOT:PSS-LiTFSI), combinations thereof, and the like. In some embodiments, the first electrode composition can comprise PEDOT:PSS-LiTFSI.

In some embodiments, the second electrode composition can be selected from a group consisting of metal nanoparticles, nanowire, nanosheet-based electrodes (e.g. gold, silver, copper, nickel), CNT-based electrode, graphene-based electrode, carbon-based electrode, poly(3,4-ethylenedioxythiophene):poly(styrenesulfonate)-bis(trifluoromethane) sulfonimide lithium salt (PEDOT:PSS-LiTFSI), combinations thereof, and the like. In some embodiments, the first electrode composition can comprise PEDOT:PSS-LiTFSI.

In some embodiments, the passivation layer can comprise PDMS-Ecoflex (PDMS-Eco.) or the like.

In some embodiments, a method of manufacturing a stretchable electronic device can include depositing an insulating polymer 18 onto at least a portion of an inorganic substrate 28, depositing a first electrode composition 22 onto at least a portion of the inorganic substrate 28, depositing a film 20, comprising an insulating polymer 12 and a semiconducting polymer 14, wherein the semiconducting polymer 14 is present in an amount of 0.1 wt % to 3 wt %, onto at least a portion of the inorganic substrate 28, depositing a second electrode composition 24 onto at least a portion of the film 20, depositing a passivation layer 26 onto at least a portion of the second electrode composition 24, wherein at least the first electrode composition 22 adheres to the film 20, and the second electrode composition 24 adheres to the film 20 and the passivation layer 26 to form the stretchable electronic device, and separating the stretchable electronic device from the inorganic substrate 28. In some embodiments, the stretchable electronic device is separated from the inorganic substrate by peeling. In some embodiments, the film can be deposited onto the inorganic or organic substrate by spin-coating, blade-coating, spray-coating or roll-to-roll coating. In some embodiments, the semiconducting polymer is present in an amount of 0.5 wt % to 1 wt %.

In some embodiments, the work of adhesion between the passivation layer 26 and the second electrode composition 24 is higher than work of adhesion between the first electrode composition 222 and the insulating polymer 18. In some embodiments, the work of adhesion between the passivation layer 26 and the second electrode composition 24 is lower than work of adhesion between the first electrode composition 22 and the film 20.

In some embodiments, the substrate can be inorganic or organic. In some embodiments, the inorganic substrate can be selected from a group consisting of glass, silica, ceramic, quartz, concrete, combinations thereof, and the like. In some embodiments, the organic substrate can comprise plastic, resin, combinations thereof, or the like.

EXAMPLES

The following examples are illustrative, but not limiting, of the methods and compositions of the present disclosure. Other suitable modifications and adaptations of the variety of conditions and parameters normally encountered in the field, and which are obvious to those skilled in the art, are within the spirit and scope of the disclosure.

Figure 4A:
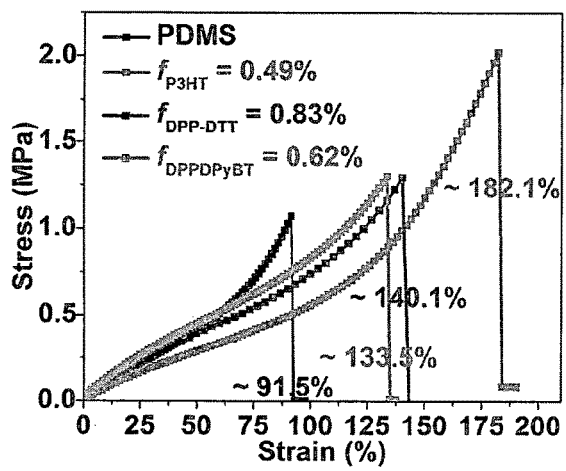
FIGS. 4A-4B depict mechanical integrity results of exemplary embodiments of stretchable materials under strain.
Figure 4B:
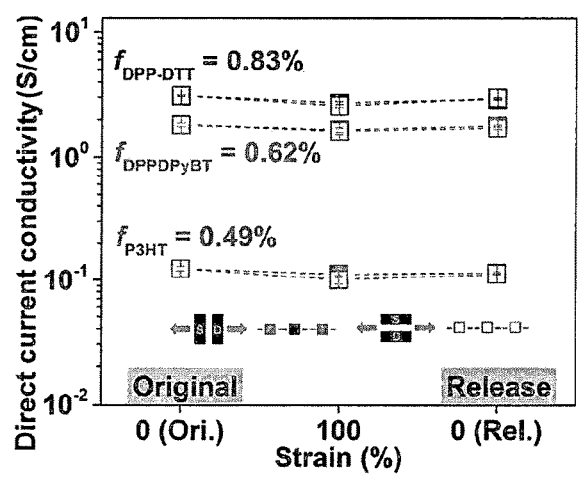

Example 1: Film Fabrication and Optical, Mechanical and Electrical Properties of Same Stretchable, semiconducting films were fabricated by blending polydimethylsiloxane (PDMS) with three distinctly different, commercially available semiconducting polymers—P3HT, DPP-DTT and DPPDPyBT, respectively, as shown in FIGS. 4A-4B. Solutions of a given semiconducting polymer in chloroform ($CHCl_3$) were mixed with PDMS. As an example, 7 $mJ/m^2$ of PDMS and 19.3 $mJ/m^2$ of P3HT were mixed. Semiconductor weight fractions as low as 0.49-0.83 wt % afforded the best performance. Specifically, semiconducting films exhibited ~10-fold, 2-fold and 3-fold mobility enhancement compared to control samples (100 wt %) of P3HT, DPP-DTT and DPPDPyBT, respectively, as shown in Table 1, below.

Surprisingly, incorporation of less than 1 wt % of the semiconducting polymer led to films that could be stretched to a greater degree than a 100% PDMS control. No cracks were observed under 100% strain, which was in marked contrast to the neat semiconductors. The low proportion of the semiconducting polymer also facilitated high film transmittance at 300-1,000 nm. Semiconductor/PDMS film direct-current conductivity ($\sigma_{DC}$) as calculated from the source-drain current ($I_{DS}$) and source-drain voltage ($V_{DS}$) relationship at low $V_{DS}$, demonstrated that the average $\sigma_{DC}$ of the blend films was significantly improved compared with parent semiconductor controls. Furthermore, applying a 100% strain to the blend films led to only a slight decrease in observed $\sigma_{DC}$.

Example 2: Electronic Performance of the Semiconducting Films Under Strain

Figure 5A:
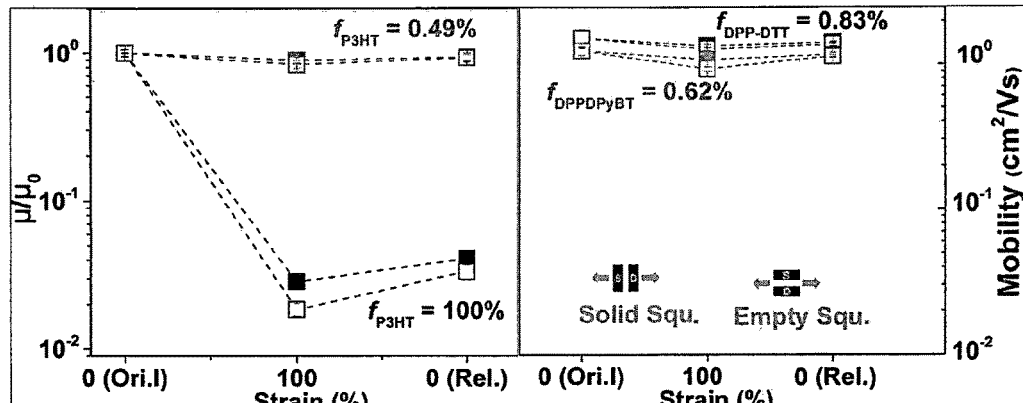
FIGS. 5A-5C depict electrical performance results of exemplary embodiments of stretchable materials.
Figure 5B:
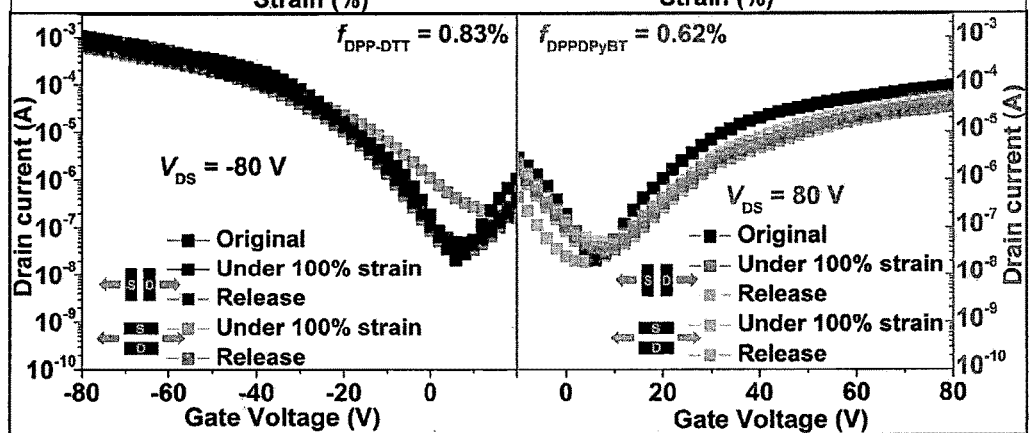
Figure 5C:
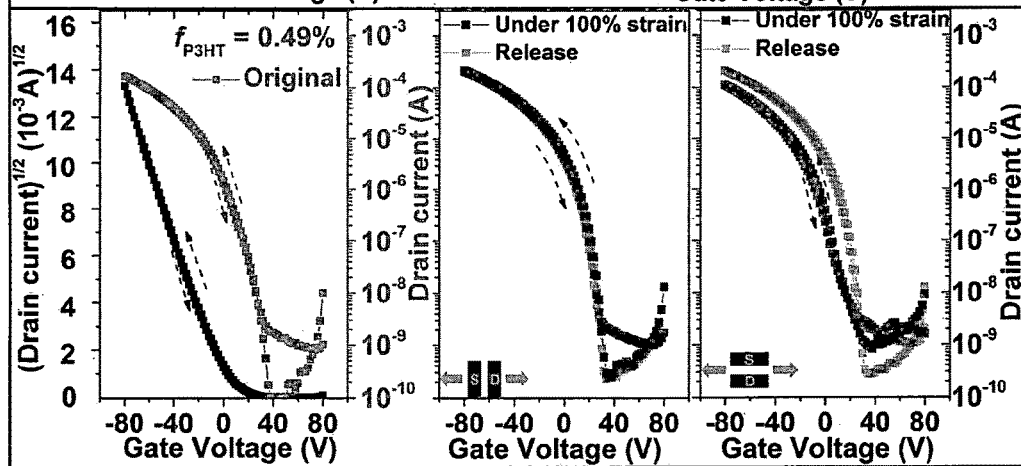

A delamination-stretching-relamination process was used to evaluate electrical performance of the stretchable semiconducting films under strain. Good ohmic contact was retained throughout, and thus device performance was not hindered during the process). As shown in FIGS. 5A-5C, subjecting the semiconductor/PDMS film to 100% strain led to a slight decrease in charge carrier mobility; however, the mobility under strain was still higher than that of the control films. Moreover, the semiconductor transfer curves under 100% strain remained unaffected.

Example 3: Phase Separation Morphology

The P3HT/PDMS blend was used as a model to determine the origins of the composite film performance characteristics. Specifically, the relationship between the film microstructure and semiconductor performance were of interest. Contact angle experiments allowed calculation of the surface free energy (Ys) of P3HT (19.3 (±0.7) $mJ/m^2$) and PDMS (7.3 (±0.3) $mJ/m^2$). Additionally, Hansen Solubility Parameter studies confirmed a lower relative energy difference (RED) between PDMS and $CHCl_3$ (0.74) compared to P3HT and $CHCl_3$ (0.98), indicating that PDMS is more soluble in $CHCl_3$ than P3HT. This suggests that the higher surface energy of P3HT and its lower solubility induce vertical phase separation during film formation.

UV-vis spectroscopy results suggest that in the presence of PDMS, P3HT undergoes more extensive aggregation than pristine P3HT: low energy P3HT bands at ~555 nm (0-1) and ~605 nm (0-0) suggest that the presence of PDMS led to P3HT aggregation in solution, likely due to the large repulsive interactions ($\chi$: 0.55) between the two compo-

TABLE 1

Optical, mechanical and electrical properties of the semiconducting films.

| | | | Semiconductors | | Stretchability (Strain %) | | Visual |
|---|---|---|---|---|---|---|---|
| | | $f_{Semi.}$ | Mobility ($cm^2/V \cdot s$) | | | Elongation | Transparency (%) |
| Type | Abbr. | (wt %) | Original | Parallel-100% | Crack On-Set | Break | (At 550 nm) |
| p | P3HT | 0.49 | 0.17 (±0.03) | 0.15 (±0.01) | | 182.1 (±8.6) | 90.8 (±0.6) |
| | | 100 | 0.02 (±0.01) | 0.006 (±0.001) | 32.6 (±4.8) | | 47.1 (±0.4) |
| | DPP-DTT | 0.83 | 1.53 (±0.22) | 1.35 (±0.04) | | 140.1 (±10.2) | 94.9 (±0.5) |
| | | 100 | 0.81 (±0.11) | 0.18 (±0.01) | 20.7 (±5.2) | | 79.6 (±0.6) |
| n | DPPDPyBT | 0.62 | 1.25 (±0.09) | 1.08 (±0.02) | | 133.5 (±7.6) | 97.1 (±0.3) |
| | | 100 | 0.43 (±0.14) | 0.12 (±0.01) | 22.5 (±4.5) | | 73.8 (±0.2) | nents. Furthermore, this interaction is expected to continue to promote P3HT aggregation via favorable π-π interactions during $CHCl_3$ evaporation. According to Spano's model, the lower exciton bandwidth (W) calculated for 0.49 wt % P3HT/PDMS indicates the presence of a higher degree of intramolecular ordering and longer conjugation length within the aggregates; the extent of aggregation was significantly increased to ~71% (~30% in solution) vs. the P3HT control (61% in film, 1.5% in solution).

Atomic force microscopy (AFM) images of the top and bottom surfaces of the P3HT/PDMS films showed that at 0.49 wt % P3HT appears to be buried in the PDMS matrix, presenting an aligned nanofibrillar structure. The nanofibrillar alignment was quantified by the orientational order parameter ($S_{2D}$) which yielded a value of 0.56.

X-ray photoelectron spectroscopy (XPS) depth profiling facilitated visualization of the location of P3HT sulfur (S 2p, ~164 eV) and PDMS silicon (Si 2p, ~102 eV) within the film. In addition to top to bottom depth profiling, the composite semiconductor was delaminated from the substrate and then etched from the bottom side. The results demonstrated that while the P3HT component was dispersed within the PDMS matrix, importantly, the polymer film-substrate interface (bottom) was highly enriched in P3HT, with PDMS appearing throughout the entire thickness. First, a halo similar to that of neat PDMS was observed for both surfaces of the film; the characteristic P3HT (100) diffractions were only observed at the bottom surface overlapping with PDMS. After subtracting PDMS, the (100) reflection was clearly apparent and (010) P3HT diffractions, attributed to inter-chain π-π stacking, were visible. The results indicate that in the PDMS blend, P3HT is a more crystalline than pristine semiconductor. The increased P3HT (010) intensity indicates that the semiconducting polymer mainly exhibited edge-on orientation, which facilitated charge transport in the devices.

Example 4: Mechanism and Evidence for Semiconductor/PDMS Interpenetrating Polymer Network Formation As shown in FIGS. 1-2, film formation takes place in a multistage process. First, there is P3HT aggregation in solution. Then, differences in surface energy and solubility facilitate vertical phase separation, resulting in a self-stratified metastable two-layer structure. During film formation, parent PDMS and curing agent chains have an opportunity to penetrate and diffuse into the evolving P3HT layer. Because of the low weight fraction of P3HT, PDMS inter-diffusion is limited but sufficient to enhance P3HT aggregate localization. As a result, a film comprising an interpenetrating interfacial network is formed.

Selective removal of the PDMS phase confirmed the presence of an IPN structure, as shown in FIG. 2. As presented in the three-dimensional and cross-sectional SEM image, the residual P3HT film appeared as a porous, networked structure. The phase separated IPN structure proved advantageous because the solubility and surface energy differences between P3HT and PDMS led to increased interactions between the semiconducting polymer chains leading to a highly networked fibrillar structure that extended into the crosslinked PDMS host. In turn, the networked semiconducting film might play a role similar to that of a plasticizer, helping increase the fluidity of PDMS chains in the biphasic region, thereby affording enhanced stretchability. The resultant IPN structure not only improved the effectiveness of charge transport pathways and elasticity, but also provided for environmental stability.

Example 5: Stretchable Optoelectronic Device Fabrication

Stretchable polymer transistor arrays comprising 86 transistors were fabricated using a poly(3,4-ethylenedioxythiophene):poly(styrenesulfonate)-bis(trifluoromethane)sulfonimide lithium salt (PEDOT:PSS-LiTFSI) for the first and second electrode compositions and a composite of PDMS-Ecoflex (PDMS-Eco.) as the passivation layer, as shown in FIG. 3. A patterned inorganic substrate was used as a base and layers of PDMS, PEDOT:PSS-LiTFSI, a stretchable P3HT/PDMS film, a second layer of PEDOT:PSS-LiTFSI, and a layer of PDMS-Eco. were deposited on top of the substrate, before the entire, resulting device was peeled away from the inorganic substrate. The peeling step was designed so that the layers with the weakest mutual adhesion occur between the bottom-most device components and the inorganic substrate, thus the thin-layer of PDMS (10-20 nm) was added between the $SiO_2$ substrate and the PEDOT: PSS electrodes. Works of adhesion (W) between the relevant layers was calculated using the surface free energy. WPDMS-Eco/PEDOT:PSS-LiTFSI is found to have a higher value compared to WPEDOT:PSS-LiTFSI/PDMS, but lower than WPEDOT:PSS-LiTFSI/(Semi.-PDMS). The different work of adhesion (W) between the various layers ensured that the one-step peel-off process could be realized. The multi-layer device architecture was further confirmed through cross-sectional SEM imaging. After 300 stretching-releasing cycles, the integrated layered structure was retained, confirming strong adhesion between device layers.

Example 6: Electronic Performance of the Stretchable Optoelectronic Device

Figure 6A:
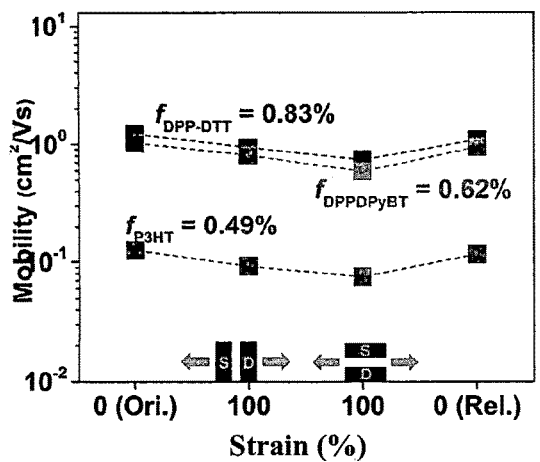
FIGS. 6A-6B depict electrical performance results of exemplary embodiments of stretchable materials.
Figure 6B:
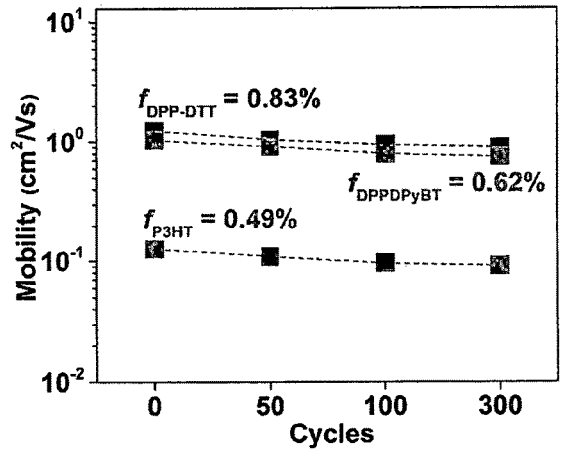

As shown in FIGS. 6A-6B, the resulting devices showed good transparency and stretchability. Specifically, FIG. 6A shows transfer curves obtained from P3HT/PDMS (0.49 wt % P3HT), DPP-DTT/PDMS (0.83 wt % DPP-DTT), and DPPDPyBT/PDMS (0.62 wt %, DPPDPyBT), in its original condition, under 100% strain (parallel, perpendicular to the charge transport direction), and release condition. FIG. 6B shows changes in mobility of the stretchable devices in their original condition, under 100% strain and after release.

Figure 7:
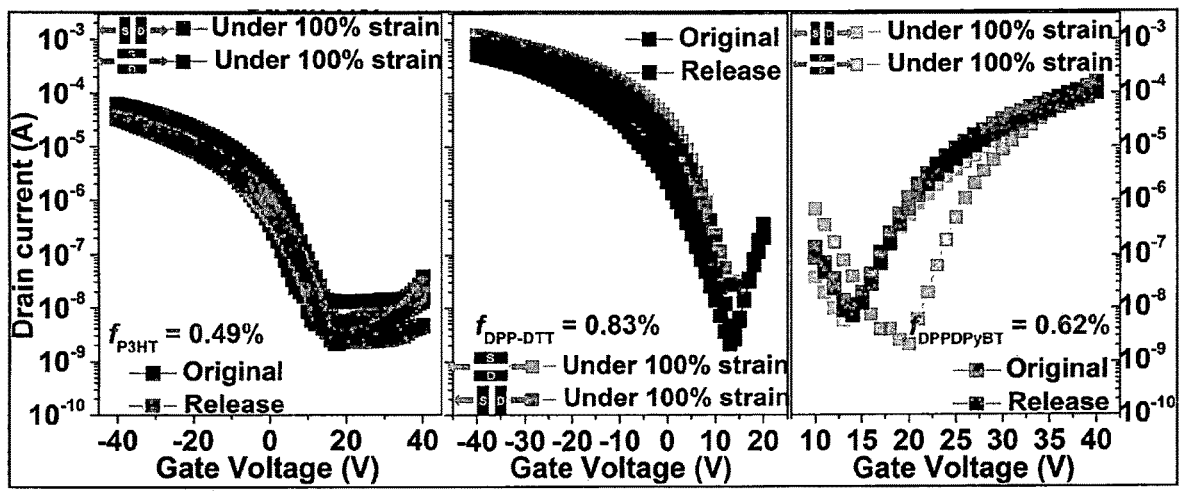
FIG. 7 depicts electrical performance results of exemplary embodiments of stretchable materials.

The P3HT-based stretchable transistors exhibited the anticipated transfer characteristics with an average mobility of 0.12 (±0.02) $cm^2/V \cdot s$ and low threshold voltage. An average mobility above 1.0 $cm^2/V \cdot s$ was obtained for DPP-DTT (1.23 (±0.03) $cm^2/V \cdot s$) and DPPDPyBT (1.02 (±0.05) $cm^2/V \cdot s$), respectively. The lower mobility obtained for the stretchable devices vs. transistors fabricated on $Si/SiO_2$ is due to differences in the dielectric and the slight decrease in electrode conductivity. Note that the under 100% strain, mobility decreased only slightly, primarily because of the associated changes in channel length, dielectric capacitance and electrode conductivity, as shown in FIG. 7. Upon releasing strain, the mobility recovered its initial values. In addition, the fully stretchable transistors exhibited stable device performance over 300 stretching cycles.

It is to be understood that the embodiments and claims disclosed herein are not limited in their application to the details of construction and arrangement of the components set forth in the description and illustrated in the drawings. Rather, the description and the drawings provide examples of the embodiments envisioned. The embodiments and claims disclosed herein are further capable of other embodiments and of being practiced and carried out in various ways. Also, it is to be understood that the phraseology and terminology employed herein are for the purposes of description and should not be regarded as limiting the claims.

Accordingly, those skilled in the art will appreciate that the conception upon which the application and claims are based can be readily used as a basis for the design of other structures, methods, and systems for carrying out the several purposes of the embodiments and claims presented in this application. It is important, therefore, that the claims be regarded as including such equivalent constructions.

The invention claimed is:

1. A stretchable film comprising:
   an insulating polymer; and
   a semiconducting polymer;
   wherein the semiconducting polymer is present in an amount of from 0.1 wt % to 3 wt;
   wherein the Young's Modulus of the stretchable film is at least 0.5 MPa;
   wherein the tensile strength of the stretchable film is at least 1.5 MPa; and
   wherein the break strain of the stretchable film is from 20% to 200%.

2. A stretchable electronic device comprising:
   a semiconducting film comprising:
     an insulating polymer; and
     a semiconducting polymer;
   a first electrode layer;
   a second electrode layer; and
   a stretchable support layer;
   wherein the semiconducting polymer is present in the semiconducting film in an amount of 0.1 wt % to 3 wt %.

3. The device of claim 2, wherein:
   the semiconducting film has a first side and a second side;
   the second electrode layer has a first side and a second side;
   the first side of the semiconducting film is disposed proximate the first electrode layer;
   the first side of the second electrode is disposed proximate the second side of the semiconducting film; and
   the second side of the second electrode layer is disposed proximate the stretchable support layer.

4. The device of claim 3, wherein the first electrode layer comprises PEDOT:PSS-LiTFSI.

5. The device of claim 3, wherein the second electrode layer is selected from the group consisting of metal nanoparticles, nanowires, nanosheet-based electrodes (e.g. gold, silver, copper, nickel), CNT-based electrode, graphene-based electrode, carbon-based electrode, poly(3,4-ethylenedioxythiophene):poly(styrenesulfonate)-bis (trifluoromethane) sulfonimide lithium salt (PEDOT:PSS-LiTFSI), and combinations thereof.

6. The device of claim 3, wherein the second electrode layer comprises PEDOT:PSS-LiTFSI.

7. The device of claim 3, wherein the stretchable support layer comprises PDMS-Ecoflex (PDMS-Eco.).

8. The device of claim 3, wherein the charge mobility of the device is at least 0.01 cm2/Vs.

9. The method of manufacturing the stretchable electronic device of claim 2 comprising:
   depositing an insulating polymer release layer onto at least a portion of a substrate;
   depositing the first electrode layer onto at least a portion of the substrate;
   depositing the semiconducting film onto at least a portion of the substrate;
   depositing the second electrode layer onto at least a portion of the semiconducting film;
   depositing the stretchable support layer onto at least a portion of the second electrode layer; and
   separating the deposited layers and semiconducting film from the substrate;
   wherein at least the first electrode layer adheres to the semiconducting film; and
   wherein the second electrode layer adheres to the semiconducting film and the stretchable support to form the stretchable electronic device.

10. The method of claim 9, wherein the stretchable electronic device is separated from the substrate by peeling.

11. The method of claim 9, wherein the insulating polymer release layer comprises PDMS.

12. The method of claim 9, wherein the semiconducting polymer is selected from the group consisting of P3HT, DPP-DTT and DPPDPyBT.

13. The method of claim 9, wherein the first electrode layer 9 is selected from the group consisting of metal nanoparticles, nanowires, nanosheet-based electrodes (e.g. gold, silver, copper, nickel), CNT-based electrode, graphene-based electrode, carbon-based electrode, poly(3,4-ethylenedioxythiophene):poly(styrenesulfonate)-bis (trifluoromethane) sulfonimide lithium salt (PEDOT:PSS-LiTFSI), and combinations thereof.

14. The method of claim 9, wherein the second electrode layer comprises PEDOT:PSS-LiTFSI.

15. The method of claim 9, wherein the stretchable support layer comprises PDMS-Eco.

16. The method of claim 9, wherein depositing the semiconducting film comprises is selected from the group consisting of spin-coating, blade-coating, spray-coating, and roll-to-roll coating the semiconducting film onto the substrate.

17. The method of claim 9, wherein the semiconducting film is phase-separated and interpenetrating.

18. The method of claim 9, wherein work of adhesion between the stretchable support layer and the second electrode layer is higher than work of adhesion between the first electrode layer and the insulating polymer release layer, but lower than work of adhesion between the first electrode layer and the semiconducting film.

19. A method for manufacturing a stretchable electronic;
    depositing a film on a first electrode layer, wherein the film comprises an insulating polymer and a semiconducting polymer, and wherein the semiconducting polymer is present in the film in an amount of 0.1 wt % to 3 wt %;
    depositing a second electrode layer onto the film; and
    depositing a stretchable support layer onto the second electrode layer.

20. The method of claim 19 further comprising:
    depositing an insulating polymer release layer onto a substrate;
    depositing the first electrode layer onto the substrate; and
    separating the deposited layers and film from the substrate;
    wherein the substrate is selected from the group consisting of glass, silica, ceramic, quartz, plastic and combinations thereof.

* * * * *